United States Patent
Semonin et al.

(10) Patent No.: US 12,021,164 B2
(45) Date of Patent: Jun. 25, 2024

(54) SPUTTERED THEN EVAPORATED BACK METAL PROCESS FOR INCREASED THROUGHPUT

(71) Applicant: Utica Leaseco, LLC, Rochester Hills, MI (US)

(72) Inventors: Octavi Santiago Escala Semonin, San Francisco, CA (US); Reto Adrian Furler, San Jose, CA (US); Hasti Majidi, San Jose, CA (US); Kristen Sydney Hessler, Menlo Park, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 192 days.

(21) Appl. No.: 17/459,611

(22) Filed: Aug. 27, 2021

(65) Prior Publication Data

US 2021/0391494 A1    Dec. 16, 2021

Related U.S. Application Data

(62) Division of application No. 16/399,012, filed on Apr. 30, 2019, now Pat. No. 11,107,942.

(51) Int. Cl.
*H01L 31/0216* (2014.01)
*H01L 31/0304* (2006.01)
(Continued)

(52) U.S. Cl.
CPC .... *H01L 31/1844* (2013.01); *H01L 31/02168* (2013.01); *H01L 31/03046* (2013.01);
(Continued)

(58) Field of Classification Search
CPC .. H01L 31/18; H01L 31/0216; H01L 31/0304
See application file for complete search history.

(56) References Cited

U.S. PATENT DOCUMENTS 8,962,381 B2   2/2015   Krokoszinski
2010/0101633 A1  4/2010  Park et al.
(Continued)

FOREIGN PATENT DOCUMENTS

CN   108091719 A   5/2018
EP   2450956 A2    5/2012
(Continued)

OTHER PUBLICATIONS

Martin et al, "Hybrid deposition of sputtered and evaporated multilayer thin films", Journal of Vacuum Science & Technology B: Microelectronicsprocessing and Phenomena, American Vacuum Society, New York, NY, US, vol. 21, No. 4, Jun. 30, 2003, pp. 1384-1390.
(Continued)

*Primary Examiner* — Dale E Page
*Assistant Examiner* — Wilner Jean Baptiste
(74) *Attorney, Agent, or Firm* — ARENTFOX SCHIFF LLP

(57) ABSTRACT

A method is described that includes sputtering multiple layers on a back surface of the photovoltaic structure, the photovoltaic structure being made of at least one group III-V semiconductor material, and evaporating, over the multiple layers, one or more additional layers including a metal layer, the back metal structure being formed by the multiple layers and the additional layers. A photovoltaic device is also described that includes a back metal structure disposed over a back surface of a photovoltaic structure made of a group III-V semiconductor material, the back metal structure including one or more evaporated layers disposed over multiple sputtered layers, the one or more evaporated layers including a metal layer. By allowing evaporation along with sputtering, tool size and costs can be reduced, including minimizing a number of vacuum breaks. Moreover, good
(Continued)

yield and reliability, such as reducing dark line defects (DLDs), can also be achieved.

20 Claims, 9 Drawing Sheets

(51) Int. Cl.
  *H01L 31/054* (2014.01)
  *H01L 31/056* (2014.01)
  *H01L 31/0687* (2012.01)
  *H01L 31/0725* (2012.01)
  *H01L 31/0735* (2012.01)
  *H01L 31/18* (2006.01)

(52) U.S. Cl.
  CPC ........ *H01L 31/0547* (2014.12); *H01L 31/056* (2014.12); *H01L 31/0687* (2013.01); *H01L 31/0725* (2013.01); *H01L 31/0735* (2013.01)

(56) References Cited

U.S. PATENT DOCUMENTS

| 2010/0186813 | A1 | 7/2010 | Knoll et al. |
| 2013/0221373 | A1 | 8/2013 | Chen et al. |
| 2016/0087115 | A1 | 3/2016 | Hwang et al. |
| 2016/0087234 | A1 | 3/2016 | Song |
| 2016/0211431 | A1 | 7/2016 | Yang |
| 2017/0141256 | A1* | 5/2017 | Kayes ............... H01L 31/06875 |
| 2017/0178948 | A1* | 6/2017 | Leobandung ..... H01L 21/76877 |
| 2018/0151771 | A1 | 5/2018 | Shibasaki et al. |

FOREIGN PATENT DOCUMENTS

| KR | 20120068226 A | 6/2012 |
| KR | 1020120113130 A | 10/2012 |
| WO | 2010014761 A1 | 2/2010 |

OTHER PUBLICATIONS

Extended European Search Report mailed Nov. 16, 2022 in European Patent Application No. 20798666.2.

Marten, et al., "Hybrid deposition and sputtered and evaporated multilayer thin films," Journal of Vacuum Science Technology B; Publication [online]. Jun. 30, 2003 [retrived Jun. 30, 2020]. Retrieved from the Internet: <URL:http://avs.scitation.org/doi/abs/10.1116/1.1591745>; DOI: 10.116/1.1591745, 6 pages.

International Search Report issued in PCT/US2020/030683, dated Sep. 9, 2020, 3 pages.

Written Opinion of the International Searching Authority issued in PCT/US2020/030683, dated Sep. 9, 2020, 8 pages.

* cited by examiner

70

```
Sputter multiple layers on a back surface of the photovoltaic
structure, the photovoltaic structure being made of at least one
group III-V semiconductor material
80
```

```
Sputter a layer closest to the back surface and configured
to adhere remaining layers of the multiple layers to the
back surface of the photovoltaic structure
81
```

```
Sputter a layer made of a reflecting material
83
```

```
Sputter a layer that is closest to the one or more additional
layers and is configured to provide a barrier for migration
from the metal layer to the photovoltaic structure
85
```

```
Evaporate, over the multiple layers one or more additional
layers including a metal layer, wherein the back metal structure
is formed by the multiple layers and the one or more additional
layers.
90
```

SPUTTERED THEN EVAPORATED BACK METAL PROCESS FOR INCREASED THROUGHPUT

CROSS REFERENCE TO RELATED APPLICATIONS

The current application is a divisional application of U.S. patent application Ser. No. 16/399,012, the entire contents of which are hereby incorporated by reference.

BACKGROUND

The present disclosure relates generally to metal contacts in optoelectronic devices, and more specifically, to a process that uses both sputtering and evaporation for increased throughput when producing a back metal structure in an optoelectronic device such as a photovoltaic device.

Metal structures used in back metal contacts for optoelectronic devices such as, but not limited to, photovoltaic devices (e.g., solar cells), include multiple sputtered layers. The back metal contacts can be deposited using a large number of sputtering targets, with each target running at a moderate power. By spacing the targets out and spreading the deposition in time it is possible to reduce the temperature load of the wafers used to build the photovoltaic devices. Such spacing of the targets, however, tends to increase capital costs as the tools may need to be longer and include more targets.

Developing processes that can reduce tool size and costs, and/or that require a minimum number of vacuum breaks is generally desirable. Moreover, it is also desirable that these processes can provide good yield and reliability, such as reducing or limiting dark line defects (DLDs).

SUMMARY OF THE DISCLOSURE

In an aspect of this disclosure, a method of forming a back metal structure on a photovoltaic structure is described that includes sputtering multiple layers on a back surface of the photovoltaic structure, the photovoltaic structure being made of at least one group III-V semiconductor material, and evaporating, over the multiple layers, one or more additional layers, where the back metal structure is formed by the multiple sputtered layers and the one or more additional evaporated layers. In some examples, a deposition rate from the evaporating of the one or more additional layers is greater than a deposition rate from the sputtering of the multiple layers. In some examples, a duration of the evaporating of the one or more additional layers is shorter than a duration of the sputtering of the multiple layers. The sputtering of the multiple layers may include sputtering a layer closest to the back surface of the photovoltaic structure, the layer being configured to adhere remaining layers of the multiple layers to the back surface of the photovoltaic structure. The sputtering of the multiple layers may include sputtering a layer made of a reflecting material. The sputtering of the multiple layers may include sputtering a layer that is closest to the one or more additional layers, the layer being configured to provide a migration barrier from the metal layer to the photovoltaic structure.

In another aspect of this disclosure, a photovoltaic device is described that includes a photovoltaic structure made of a group III-V semiconductor material, and a back metal structure disposed over a back surface of the photovoltaic structure, the back metal structure including multiple sputtered layers and one or more evaporated layers disposed over the multiple sputtered layers, the one or more evaporated layers including a metal layer. The multiple sputtered layers may include a layer closest to the back surface of the photovoltaic structure, the layer being configured to adhere remaining layers of the multiple sputtered layers to the back surface of the photovoltaic structure. The multiple sputtered layers may include a layer made of a reflecting material. The multiple sputtered layers may include a layer that is closest to the one or more evaporated layers, the layer being configured to provide a migration barrier from the metal layer to the photovoltaic structure.

By allowing evaporation along with sputtering in connection with the method and/or the photovoltaic device described herein, tool size and costs can be reduced, and/or a number of vacuum breaks can be minimized. Moreover, it is also possible to achieve good yield and reliability by, for example, reducing dark line defects (DLDs).

BRIEF DESCRIPTION OF THE DRAWINGS

The appended drawings describe only some implementations for illustrative purposes and are therefore not to be considered limiting of scope.

FIG. 3 illustrates a flow chart of a method of forming a back metal structure on a photovoltaic structure.

DETAILED DESCRIPTION

Figure 1A:
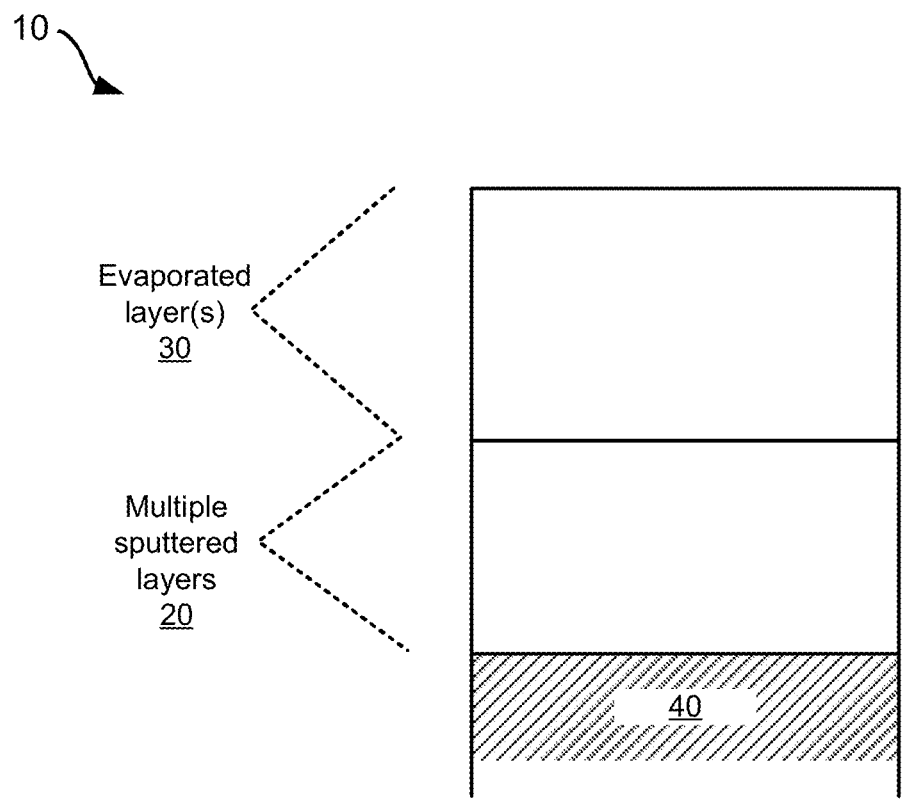
FIGS. 1A and 1B illustrate an implementation of a back metal structure on a back surface of a photovoltaic structure.

The present disclosure relates generally to metal contacts in optoelectronic devices, and more specifically, to a process that uses both sputtering and evaporation for increased throughput when producing a back metal structure in an optoelectronic device such as a photovoltaic device.

The following description is presented to enable one of ordinary skill in the art to make and use aspects of this disclosure and is provided in the context of a patent application and its requirements. Various modifications to implementations and the generic principles and features described herein will be readily apparent to those skilled in the art. Thus, the present disclosure is not intended to be limited to the implementations shown, but is to be accorded the widest scope consistent with the principles and features described herein.

A back metal structure is an arrangement of different layers that are used to form a back contact layer or back contacts in a photovoltaic device or solar cell. In a non-limiting example, the back metal structure is a stack of layers that includes a first layer that is a thin layer next or adjacent to a back surface of a photovoltaic structure (e.g., a light-capturing semiconductor structure of the photovoltaic device) that provides adhesive functionality for the remaining layers of the back metal structure (sometimes referred to as a glue or adhesive layer). The stack of layers can optionally include a second layer made of a reflective material (sometimes referred to as a reflective layer). The stack of layers can also include a third layer that provides a migration barrier to prevent material migration to the photovoltaic structure (sometimes referred to as a barrier layer). The stack of layers can also include a fourth layer that is a thick layer of a highly conductive material such as a metal (sometimes referred to as a metal layer). The fourth layer can be made of, for example, copper, and the third layer can be used to prevent migration or diffusion of copper into the photovoltaic structure.

The process of forming this type of back metal structure is fully sputtered. That is, each of the layers included in the back metal structure are formed by sputtering. Sputtering typically refers to a process whereby particles are ejected from a solid target material due to bombardment of the target by energetic particles and the ejected particles are then deposited on an intended surface.

In order to keep the sputtering process temperature below a desired temperature limit (e.g., about 250° C.), the various layers of the back metal structure are deposited using a large number of sputtering targets, with each target running at a moderate power level. By spacing the sputtering targets and spreading the deposition in time it is possible to control the temperature to reduce the temperature load on the wafers or substrates on which the photovoltaic devices are being made. This approach, however, tends to significantly increase capital costs by having to use a much longer tool and a large number of sputtering targets. This approach also increases processing time, which reduces the overall throughput.

Rather than using a process that involves only sputtering, having a process or method that can evaporate at least one layer (e.g., the thick metal layer) instead could result in reduced tool size and operating cost because the evaporated layer can be deposited at much higher deposition rates than those used for sputtering without exceeding the desired temperature limit. Some of the layers in the back metal structure (e.g., the first layer and the third layer) may be made of materials or alloys that cannot be evaporated and because evaporation requires a different chamber pressure, such a process would require a vacuum break any time it needs to change from sputtering to evaporation or from evaporation to sputtering.

A challenge is to implement a process and a corresponding back metal structure that when implemented would reduce the overall capital costs by having a simpler sputtering operation with fewer targets and thereby smaller equipment. Such a process is also to require a minimum number of vacuum breaks (e.g., one vacuum break if possible), while also providing for good yield and reliability. One approach is to change the stack of layers in the back metal structure to a structure or arrangement that allows for a process or method in which at least one of the layers, preferably a thick layer, may be deposited by evaporation in order to reduce the size and cost of the sputtering tool and to increase manufacturing throughput by using the higher evaporation deposition rates. Such a stack of layers may therefore include just the first layer (e.g., the glue or adhesive layer), optionally the second layer (e.g. the reflective layer), the third layer (e.g., the barrier layer), and the fourth layer (e.g., the metal layer) described above, with the first, second, and/or third layers being deposited by sputtering and the fourth layer being deposited by evaporation and potentially at a much higher deposition rate. This approach, however, can have some reliability issues, in particular with defects called dark line defects or DLDs. Eliminating this reliability issue in connection with the process of sputtering multiple layers (e.g., the first, second, and/or third layers) of the back metal structure and also evaporating at least one additional layer (e.g., the fourth layer—thick metal layer) of the back metal structure is therefore needed to make such a process a viable solution.

In this disclosure, a back metal structure process and a corresponding back metal structure are proposed that reduce capital costs and/or equipment size, and increases overall throughput. Such as process may also provide appropriate reliability and reasonable yields by involving the following aspects or features that are different from previous processes or methods. Moreover, the back metal structure formed using the proposed processes or methods may be used in connection with the back metal contacts for a wide range of photovoltaic devices, non-limiting examples of such devices are also described below.

First, a base stack (e.g., a base stack of layers) is sputtered at low pressure. The base stack may include the multiple sputtered layers of the back metal structure (with one or more additional layers evaporated over the base stack to form the complete back metal structure). The base stack, which may be also be referred to as a first portion of the back metal structure, may include the first layer, the second layer, and/or the third layer described above. The low pressure can be a pressure that is less than some baseline process level such as, for example, 9 millitorr (mTorr) pressure. The low pressure can help prevent the formation of DLDs.

Second, in addition to the low pressure sputtering of the base stack, the third layer (e.g., the barrier layer) can be sputtered at a high power. Using low power deposition may increase the formation of DLDs. Moreover, using low power deposition may make the third layer more susceptible to etching by hydrofluoric acid (HF), which may be used in, for example, an epitaxial liftoff (ELO) operation as part of the overall fabrication of the photovoltaic device (e.g., the solar cell). Since both of these issues can have a negative impact, sputtering of the third layer at a high power can provide improved results. In a non-limiting example, the third layer may be deposited at a baseline normalized power of 1 Watt/cm$^2$ or greater.

Third, increasing a thickness of the third layer can also prevent the formation of DLDs. In one example, the thickness of the third layer can be set to be greater than 100 nanometers (nm).

Fourth, evaporating the fourth layer (e.g., the thick metal layer) not only reduces the time it takes to deposit the layer because of the higher deposition rates that can be achieved using evaporation, but such an approach may also reduce the tendency to form DLDs when compared to sputtering.

A proposed back metal stack or back metal structure is made up of multiple sputtered layers combined with one or more evaporated layers which are deposited subsequent to and over the sputtered layers. The sputtered layers are also referred to as a base stack, a sputtered segment, or a first portion of the back metal structure. The evaporated layers are also referred to as additional layers, an evaporated segment, or a second portion of the back metal structure.

In one example, by evaporating the fourth layer (e.g., thick metal layer) of the back metal structure on top of the multiple sputtered layers instead of sputtering the fourth layer, the overall or total process of forming the back metal structure can be reduced by approximately 66% (e.g., from 1.5 hours to 30 minutes), where a majority of that time is used for sputtering the multiple sputtered layers (e.g., the first layer, the second layer, and/or the third layer). This is a significant improvement in manufacturing efficiency, particularly for high-volume manufacturing operations. The use of a brief air break between the sputtering and the evaporation processes does not have a significant impact on the overall throughput gain achieved, and does not appear to compromise performance, yield, or reliability.

FIG. 1A illustrates an implementation of a back metal structure 10 that includes multiple sputtered layers 20 over a back surface of a photovoltaic structure 40 (or a back surface of a semiconductor structure that is part of the photovoltaic structure 40). As mentioned above, the multiple sputtered layers 20 may also be referred to as a base stack, a sputtered segment, or a first portion of the back metal structure 10. The back metal structure 10 also includes one or more evaporated layers 30, which may be referred to as additional layers to the base stack, an evaporated segment, or a second portion of the back metal structure 10. The multiple sputtered layers 20 may be disposed directly over the photovoltaic structure 40, and the evaporated layer(s) 30 may be disposed directly over the multiple sputtered layers 20. While the multiple sputtered layers 20 may be placed directly over the photovoltaic structure 40, there may be instances in which at least one thin layer may exist between the multiple sputtered layers 20 and the photovoltaic structure 40.

Figure 1B:
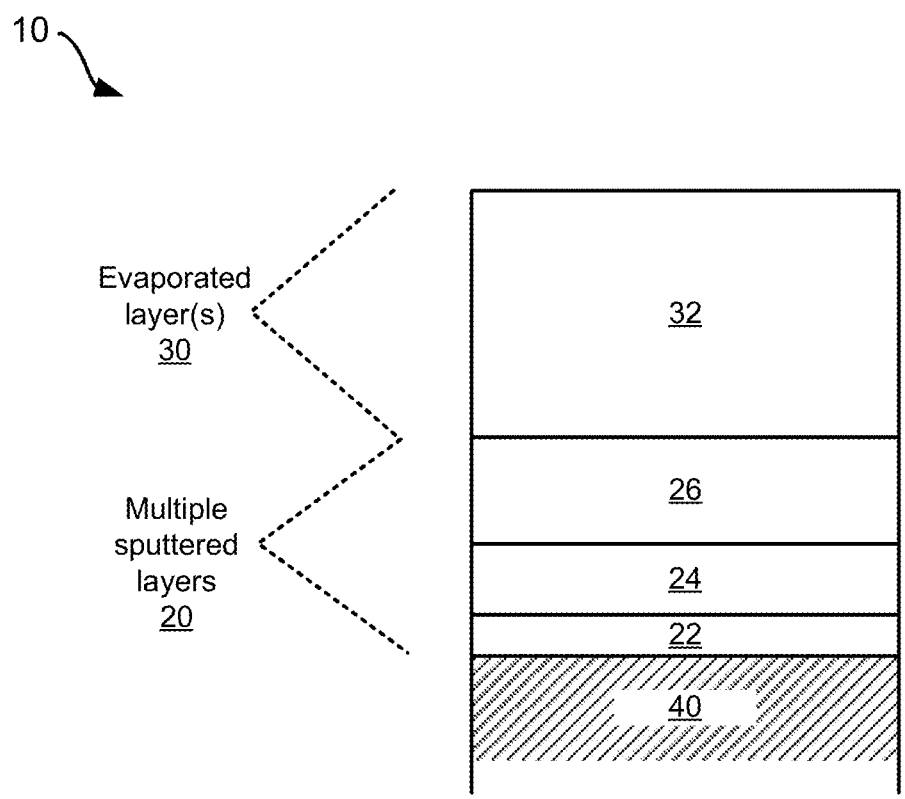

FIG. 1B illustrates implementation more detailed view of the back metal structure 10 where the multiple sputtered layers 20 disposed over the back surface of the photovoltaic structure 10 may include a first layer 22 (e.g., a glue or adhesive layer as described in connection with the first layer above), a second layer 24 (e.g., a reflective layer as described in connection with the second layer above), and/or a third layer 26 (e.g., a barrier layer as described in connection with the third layer above). The one or more evaporated layers 30 disposed over the multiple sputtered layers 20 may include at least a fourth layer 32 (e.g., a thick metal layer as described in connection with the fourth layer above). In some implementations, the first layer 22 may be thinner than the second layer 24, which in turn may be thinner than the third layer 26, which in turn may be thinner than the fourth layer 32. In some instances, the order of some of the sputtered layers 20 may be changed.

A photovoltaic device (e.g., a solar cell) can be implemented using the back metal structure 10 described in the implementations in FIGS. 1A and 1B. For example, a photovoltaic device or solar cell can include a photovoltaic structure (e.g., a semiconductor structure configured to capture light for electrical conversion) and a back metal structure (e.g., the back metal structure 10) disposed over a back surface of the photovoltaic structure, the back metal structure including a first portion having multiple sputtered layers and a second portion having at least one evaporated layer.

Figure 2:
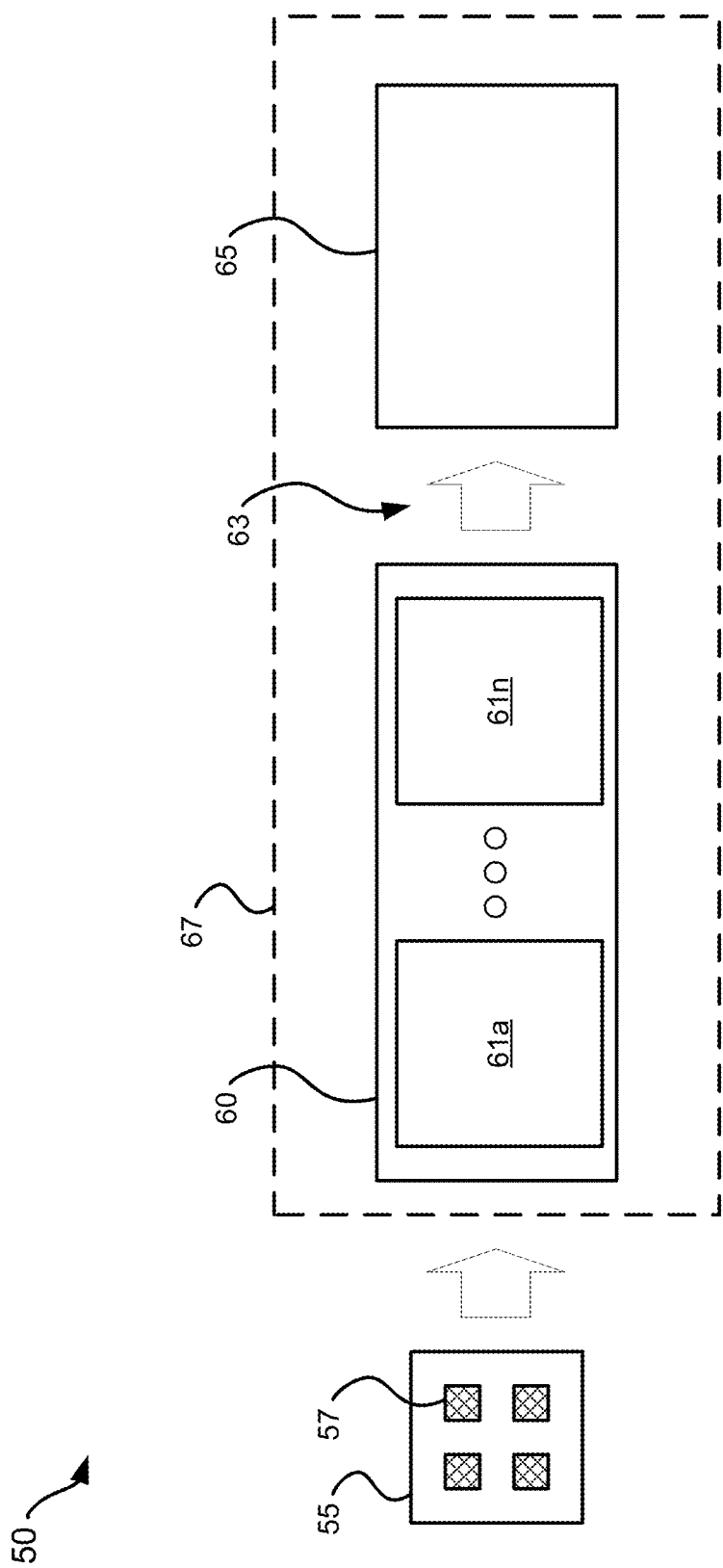
FIG. 2 illustrates a process and system for forming a back metal structure that includes both sputtering and evaporation.

FIG. 2 illustrates an example of a process and a system for forming a back metal structure that includes both sputtering and evaporation. A system 50 is described in which a platen 55 with multiple wafers 57 on which a back metal structure (e.g., the back metal structure 10) is to be deposited is provided to a sputtering component 60. The sputtering component 60 is configured to perform sputtering of the multiple sputtering layers (e.g., the multiple sputtering layers 20) on back surfaces of photovoltaic structures in the wafers 57. The sputtering component 60 may include multiple targets 61a, 61n that are used to sputter the appropriate materials and/or alloys as part of forming the multiple sputtered layers. Once the operation by the sputtering component 60 is completed, the platen 55 with the multiple wafers 57 goes through one air or vacuum break 63 and is provided to an evaporation component 65 configured to perform the evaporation of one or more layers (e.g., one or more evaporated layers 30) over the multiple sputtered layers.

The sputtering component 60 may be a single processing tool or equipment (e.g., a sputtering chamber) that is separate from the evaporation component 65 (e.g., an evaporation chamber), which may also be a single processing tool or equipment. In another implementation, the sputtering component 60 and the evaporation component 65 may both be part of a same processing tool or equipment 67 and may be integrated or connected in such a way to form part of the same processing tool or equipment. The number of targets needed in the sputtering component 60 may be reduced because one or more thick layers are deposited using the evaporation component 65, which may reduce the overall cost of the system 50. Also, as discussed above, the process or operation may be faster because of the higher deposition rates that can be achieved with the evaporation component 65.

FIG. 3 illustrates a flow chart of a method 70 of forming a back metal structure (e.g., the back metal structure 10) on a photovoltaic structure or device (see examples in FIGS. 4-9). The method or process 70 may be used as part of forming or manufacturing a photovoltaic device that uses the back metal structure. In an aspect, the method or process 70 may be performed using, for example, the sputtering component 60 and the evaporation component 65 shown in FIG. 2.

The method 70 includes, at 80, sputtering multiple layers (e.g., the multiple sputtered layers 20) on a back surface of the photovoltaic structure (e.g., the photovoltaic structure 40), the photovoltaic structure being made of at least one group III-V semiconductor material (e.g., one or more of InGaP, AlInGaP, GaAs, AlGaAs, InGaAs, AlInGaAs, InGaAsP, AlInP, or AlGaAs). The photovoltaic structure need not be so limited and can be made at least partially from materials other than group III-V semiconductor materials.

At 81, as part of 80, the method 70 may include sputtering of the multiple layers includes sputtering a layer closest to the back surface of the photovoltaic structure (e.g., the first layer 22—a glue or adhesive layer), the layer being configured to adhere remaining layers of the multiple layers to the back surface of the photovoltaic structure.

At 83, as part of 80, the method 70 may include sputtering a layer made of a reflecting material (e.g., the second layer 24—a reflective layer).

The method includes, at 90, evaporating, over the multiple layers, one or more additional layers (e.g., the one or more evaporated layers 30) including a metal layer (e.g., the fourth layer 32—a thick metal layer such as a copper layer), wherein the back metal structure is formed by the multiple layers and the one or more additional layers.

At 85, as part of 80, the method 70 may include sputtering a layer that is closest to the one or more additional layers (e.g., the third layer 26—a barrier layer), the layer being configured to provide a migration barrier from the metal layer to the photovoltaic structure. The layer from the multiple layers that is closest to the one or more additional layers has a thickness greater than 100 nanometers.

In an aspect of the method 70, a deposition rate from the evaporating of the one or more additional layers is greater than a deposition rate from the sputtering of the multiple layers.

In another aspect of the method 70, a duration of the evaporating of the one or more additional layers is shorter than a duration of the sputtering of the multiple layers.

In another aspect of the method 70, the sputtering of the multiple layers is a low-pressure sputtering process.

In yet another aspect of the method 70, the sputtering of the multiple layers includes sputtering one or more of the multiple layers at a target power of 1 Watt/cm$^2$ or higher.

In another aspect of the method 70, the method may further include performing an air break between the sputtering and the evaporating (see e.g., FIG. 2—air or vacuum break 63 between the sputtering component 60 and the evaporation component 65).

In another aspect of the method 70, the sputtering and the evaporating are both performed within a single manufacturing tool in consecutive process operations (see e.g., processing tool or equipment 67 in FIG. 2). The sputtering of the multiple layers may include applying multiple sputtering targets (e.g., the targets 61a, . . . , 61n) within a single manufacturing tool (e.g., within the sputtering component 60).

In yet another aspect of the method 70, the sputtering of the multiple layers is concurrently performed on a plurality of photovoltaic structures that include the photovoltaic structure, and the evaporating of the one or more additional layers over the multiple layers is concurrently performed on the plurality of photovoltaic structures (see e.g., the platen 55 with multiple wafers 57 onto which multiple layers are sputtered and at least one layer is evaporated).

The process or method described above allows for the fabrication of a back metal structure using a lower capital cost approach and with higher throughput (e.g., reduced fabrication time because of high growth rate of evaporating thick metal layer). This process or method also enables appropriate reliability and reasonable yield (e.g., reduced instances of DLDs).

Below are described various implementations of optoelectronic devices, such as photovoltaic devices, for example, in which contacts are used that can be based on the same or similar stack or structure of the back metal structure 10 described above. FIGS. 4-9 describe examples of photovoltaic devices with non-continuous contacts on both the front and the back side. Although the examples in FIGS. 4-9 are based on non-continuous contacts, is to be understood that the back metal structure and/or the method described above in connection with FIGS. 1A, 1B, 2, and 3 can be used with both non-continuous contacts and with continuous contacts. Moreover, the same or similar structures and/or methods may also be applied to front metal structures used in front contacts.

A plurality of non-continuous back contacts on an optoelectronic device (e.g., photovoltaic device or solar cell) can improve the reflectivity and reduce the power losses associated with the configuration of the back surface of the device. In an implementation, an optoelectronic device can be provided that has non-continuous back contacts. The completed device can be left with both sides able to accept incident light or can be backed by a dielectric and metal reflector to better trap light within the device. By reducing the amount of metal in direct contact with the semiconductor, plasmonic losses at the back contact are reduced, improving the angle-averaged reflectivity of the back contact, which in turn increases the minority carrier density in the device under illumination, improving the external fluorescence of the device and increasing the open-circuit and operating voltages of the device. These features are of particular importance in a photovoltaic cell and for light emitting diode (LED) applications. Accordingly, described below in conjunction with the accompanying figures are multiple implementations of an optoelectronic device which utilizes such contacts, which in turn can be made based on the method (see e.g., FIG. 3) and/or structure (see e.g., FIGS. 1A and 1B) described above.

By "non-continuous" it is not necessarily implied that the metal contacts are disconnected. The back metal contacts could be all connected together, or they could be disconnected. It is important merely that they do not cover the entire surface. In the same way, the front metal contacts are non-continuous yet connected, in that they do not cover the entire front surface of the device (which would block the incident sunlight in the case of a solar cell, or the exiting light in the case of an LED), and yet are connected such that power can be input or extracted by making contact to a single point on the top metal of the device (as well as making connection to the back of the device).

Figure 4:
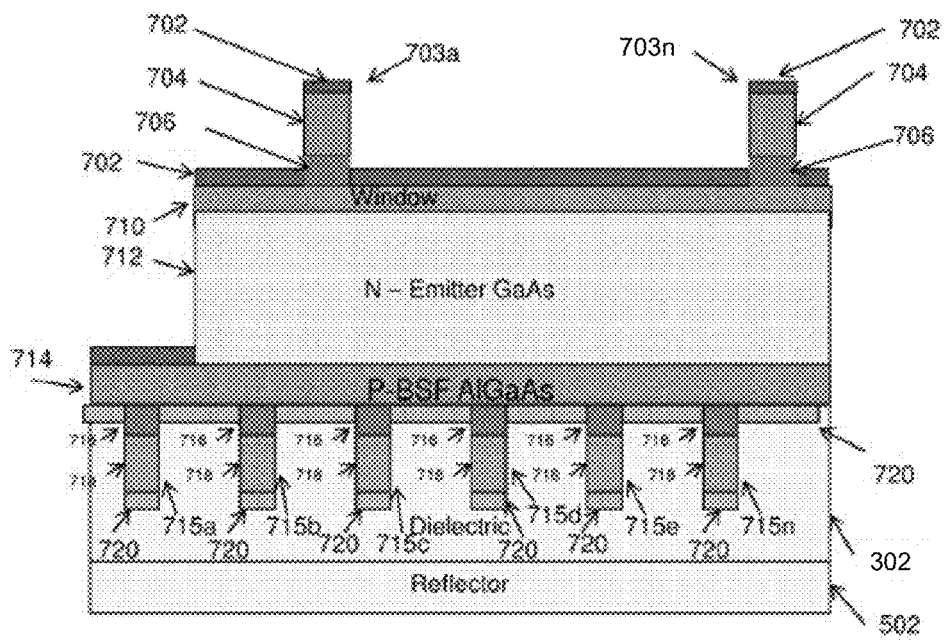
FIG. 4 illustrates a first implementation of a photovoltaic device with a reflector layer and having back metal contacts based on the back metal structure described herein.

FIG. 4 depicts a first implementation of a photovoltaic device with a reflector layer (a photovoltaic device 400). The photovoltaic device 400 includes a semiconductor structure of which all of it or portions of it can be referred to as a photovoltaic structure (e.g., photovoltaic structure 40) or a solar cell structure. In an implementation, the semiconductor structure comprises an n-layer 712 and p-layer 714 coupled together. For example, the n-layer is an n-emitter GaAs layer 712 and the p-layer is a P-BSF (Back Surface Field) AlGaAs layer 714. However one of ordinary skill in the art readily recognizes a variety of materials including but not limited to group III-V compound semiconductors such as GaAs, AlGaAs, InGaP, InGaAs, and alloys thereof, etc., may be utilized for either of these layers and that would be within the scope of the present disclosure. Furthermore, the junction formed between the two layers does not have to be a heterojunction, that is, both the n-layer 712 and p-layer 714 may be the same material (both layers being GaAs or both layers AlGaAs, for example) and that would be within the scope of the present disclosure. Also the doping could be inverted, with p-type material at the top or front of the device, facing the sun, and n-type material at the bottom or back of the device. Furthermore, the photovoltaic structure or solar cell structure could be comprised of multiple p-n layers grown in series, for example to form a multi junction solar cell.

In this implementation, on a top or front side of the semiconductor structure are a plurality of contact members 703a-703n. Each of the top-side contact members 703a-703n comprises an optional antireflective coating (ARC) 702, a n-metal contact 704 underneath the optional ARC 702, and a gallium arsenide (GaAs) contact 706 underneath the n-metal contact 704. A window layer 710 is preferably on top of the semiconductor structure. The optional ARC layer 702 is also in contact with the window layer 710, and possibly the p-type material 714 (as illustrated to the left of the figure). On a back side of the semiconductor structure is a plurality of non-continuous contacts 715a-715n. Each of the non-continuous contacts 715 includes an optional contact layer 716 coupled to the back side of the semiconductor structure and a p-metal contact 718 underneath contact layer 716. An optional ARC layer 720 may also be present on the back side of the photovoltaic device 400.

The photovoltaic device 400 also includes a reflector layer 502 which is in contact with a dielectric 302 that encapsulates the bottom side contacts 715a-715n. Typically the reflector layer 502 will be a highly reflective metal such as silver, gold, copper, or aluminum, or an alloy of one or more of these with either other metals in the list, or with other materials not on the list. The reflector layer 502 is to be a good conductor of electricity.

In an example, at least a portion of the non-continuous contacts 715a-715n in FIG. 4 can include a stack or structure such as the back metal structure 10 in FIGS. 1A and 1B, which can be made using the method or process 70 described in connection with FIG. 3 and/or using the system 50 described in FIG. 2.

Figure 5:
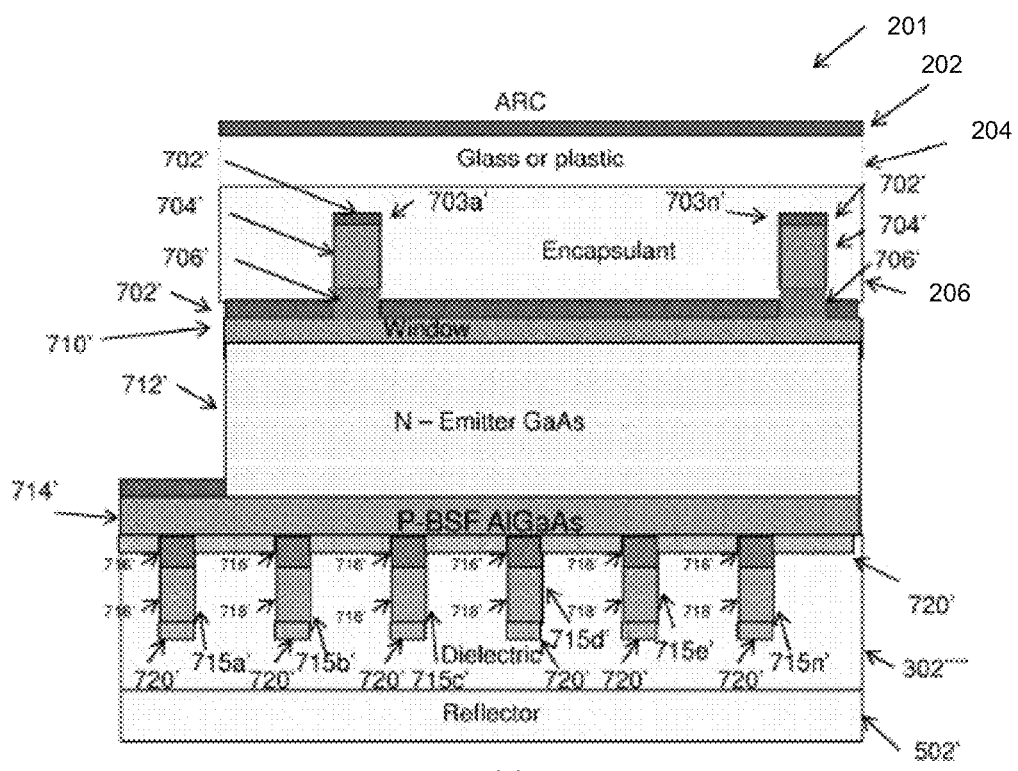
FIG. 5 illustrates a second implementation of a photovoltaic device with a reflector layer and having back metal contacts based on the back metal structure described herein.

FIG. 5 depicts a second implementation of a photovoltaic device with a reflector layer (a photovoltaic device 500). The photovoltaic device 500 is substantially similar to the photovoltaic device 400, except that it includes a top side layer 201. The top side layer 201 comprises an optional second ARC 202, a transparent member 204, such as glass or plastic, underneath the second ARC 202 and an encapsulant 206 which is underneath the transparent member 204. The encapsulant 206 surrounds top side contacts 703a'-703n'. In an example, at least a portion of non-continuous contacts 715a'-715n' in FIG. 5 can include a stack or structure such as the back metal structure 10 in FIGS. 1A and 1B, which can be made using the method or process 70 described in connection with FIG. 3 and/or using the system 50 described in FIG. 2.

In FIGS. 4-9, similar elements or components may use the same or similar reference numbers. For example, non-continuous contacts 715a-715n in FIG. 4 may correspond to non-continuous contacts 715a'-715n' in FIG. 5, where all the digits of the reference numbers are the same and an apostrophe (or more) is used to indicate a different instance associated with a different photovoltaic device structure. In another example, the optional ARC layer 702 in FIG. 4 may correspond to optional ARC layer 1102' in FIG. 8, where only the last two digits are the same and an apostrophe (or more) is used to indicate a different instance associated with a different photovoltaic device structure.

Figure 6:
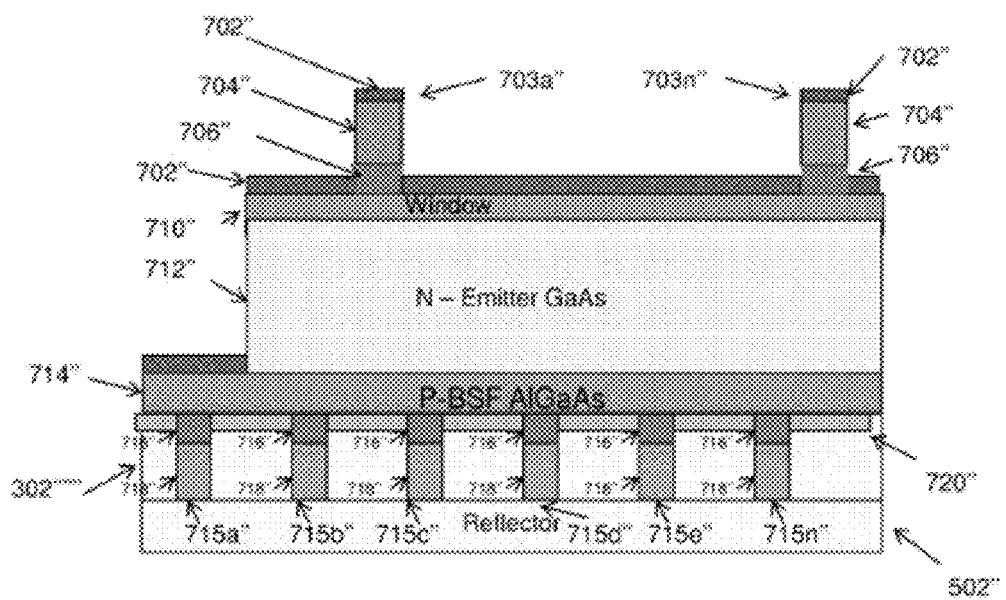
FIG. 6 illustrates a third implementation of a photovoltaic device with a reflector layer and having back metal contacts based on the back metal structure described herein.

FIG. 6 depicts a third implementation of a photovoltaic device with a reflector layer (a photovoltaic device 600). The photovoltaic device 600 is substantially the same as the photovoltaic device 400, except that a reflector layer 502" is electrically coupled to back side contacts 715a"-715n". In an example, at least a portion of the non-continuous contacts 715a"-715n" in FIG. 6 can include a stack or structure such as the back metal structure 10 in FIGS. 1A and 1B, which can be made using the method or process 70 described in connection with FIG. 3 and/or using the system 50 described in FIG. 2.

Figure 7:
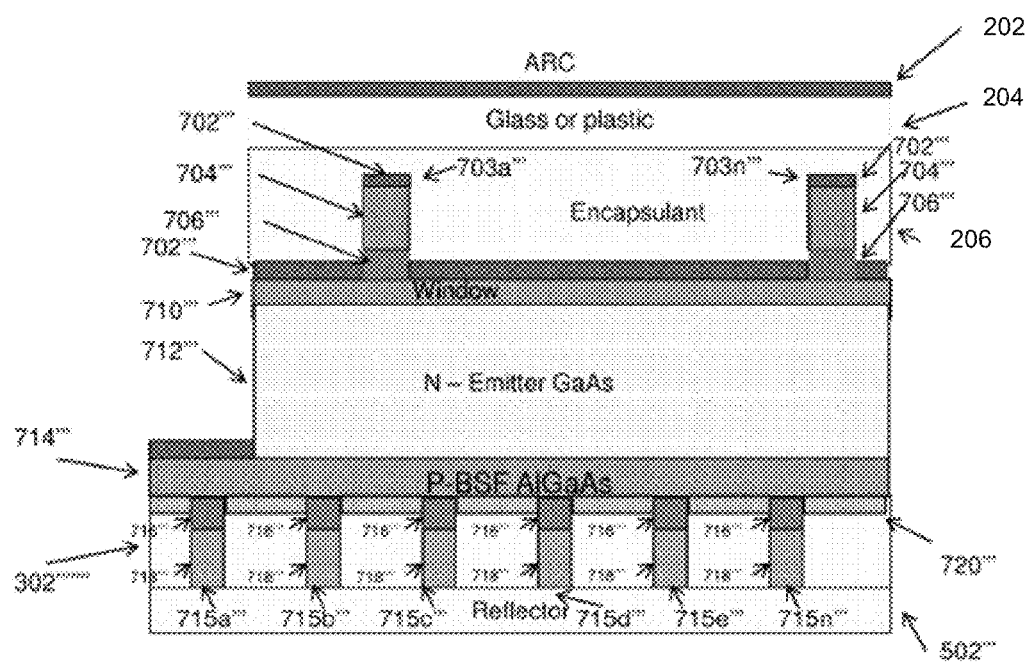
FIG. 7 illustrates a fourth implementation of a photovoltaic device with a reflector layer and having back metal contacts based on the back metal structure described herein.

FIG. 7 depicts a fourth implementation of a photovoltaic device with a reflector layer (a photovoltaic device 700). The photovoltaic device 700 is substantially similar to the photovoltaic device 500 (with optional second ARC 202, transparent member 204, and encapsulant 206), except that a reflector layer 502' is electrically coupled to back side contacts 715a"-715n". In an example, at least a portion of the non-continuous contacts 715a"-715n" in FIG. 7 can include a stack or structure such as the back metal structure 10 in FIGS. 1A and 1B, which can be made using the method or process 70 described in connection with FIG. 3 and/or using the system 50 described in FIG. 2.

Figure 8:
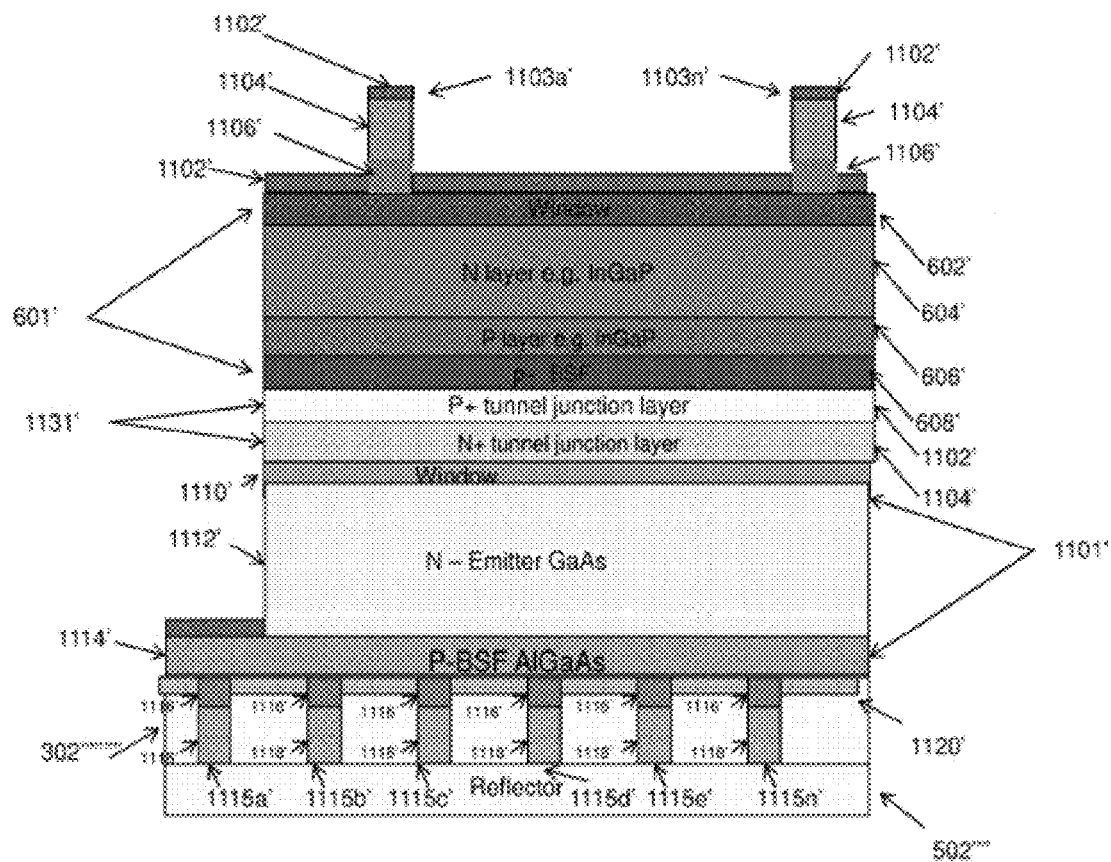
FIG. 8 illustrates a first implementation of a photovoltaic device with multiple pn junctions and having back metal contacts based on the back metal structure described herein.

FIG. 8 depicts a first implementation of a photovoltaic device with multiple pn junctions (a photovoltaic device 800). The photovoltaic device 800 is substantially similar to the photovoltaic device 600, except that an additional pn junction structure 601' of higher bandgap has been added above a structure 1101' (e.g., with n-emitter GaAs layer 1112' and the p-layer is a P-BSF AlGaAs layer 1114'). The structure 601' is comprised of a window layer 602' (for example AlInP, AlGaInP, or AlGaAs), an n-type material 604' (for example InGaP or AlGaAs), a p-type material 606' (for example InGaP or AlGaAs), and back-surface field or back side window layer 608' (for example AlInP, AlGaInP, or AlGaAs). This structure is electrically and optically connected to structure 1101' through a tunnel junction structure 1131'. The structure 1131' is comprised of a highly p-type doped layer 1102' (for example InGaP or AlGaAs), and a highly n-type doped layer 1104' (for example InGaP or AlGaAs). In an example, at least a portion of the non-continuous contacts 1115a'-1115n' in FIG. 8 can include a stack or structure such as the back metal structure 10 in FIGS. 1A and 1B, which can be made using the method or process 70 described in connection with FIG. 3 and/or using the system 50 described in FIG. 2. The photovoltaic device 800 (or similar devices having multiple pn junctions) may be referred to as a multi junction device or a multi junction structure and may include multiple sub-cells (e.g., having one or more pn junction each).

One of ordinary skill in the art readily recognizes a variety of materials listed could differ from the examples listed herein. Furthermore, the pn junction formed in structure 601' could be a homojunction or a heterojunction that is, both the n-type material 604' and p-type material 606' could be the same material, or could be different materials (e.g., materials of different molar compositions and/or materials with different elements), and that would be within the scope of the present disclosure. Also the doping could be inverted, with p-type material at the top of the device, facing the sun, and n-type material at the bottom. One or more additional pn structures could be added to structure 1101' in a similar fashion, either above or below structure 1101', and possibly coupled to the rest of the device through a tunnel junction layer or layers.

Figure 9:
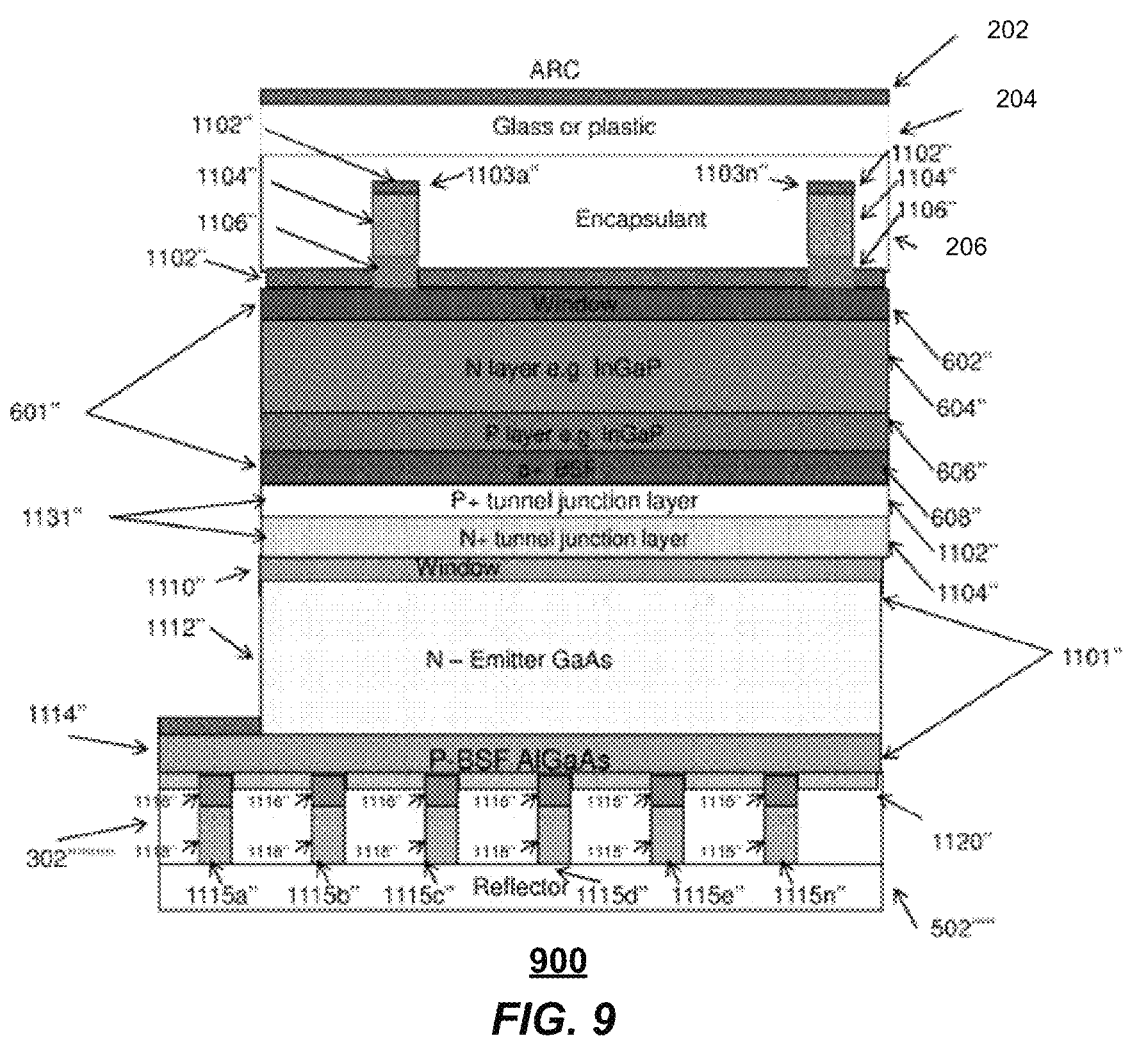
FIG. 9 illustrates a second implementation of a photovoltaic device with multiple pn junctions and having back metal contacts based on the back metal structure described herein.

FIG. 9 depicts a second implementation of a photovoltaic device with multiple pn junctions (a photovoltaic device 900). The photovoltaic device 900 is substantially similar to the photovoltaic device 800, except that it includes the optional second ARC 202, the transparent member 204, and the encapsulant 206 that surrounds the top side contacts 1103a"-1103n". In an example, at least a portion of the non-continuous contacts 1115a"-1115n" in FIG. 9 can include a stack or structure such as the back metal structure 10 in FIGS. 1A and 1B, which can be made using the method or process 70 described in connection with FIG. 3 and/or using the system 50 described in FIG. 2.

In all of the above identified implementations a plurality of non-continuous back contacts on an optoelectronic device improve the reflectivity and reduce the losses associated with the back surface of the device, for example plasmonic losses at a metal-semiconductor interface. By adding enhancements such as a dielectric material, back side reflector and the like, the reflectivity can also be improved in some applications. In addition, in an implementation the back side and/or the front side of the semiconductor can be textured to improve light scattering into and/or out of the device. Finally, it is well understood by those of ordinary skill in the art that additional layers could exist either on top of the structures shown, or underneath them. For example, underneath the reflector metal there could be other support layers such as metals, polymers, glasses, or any combination thereof.

The non-continuous metal contacts in any of the above mentioned implementations can be arranged such that there is no alignment (in the sense of an imaginary perpendicular line drawn directly through the cell) between the contacts on the top of the device and the plurality of non-continuous metal contacts directly adjacent to the semiconductor structure material on the back of the device. In some implementations, there may still be alignment between the front metal and the back mirror metal, but there will be a dielectric between them. In other implementations there is no back mirror metal. In either case, this can provide an additional advantage in that the chance of a metal-on-metal short, either during device fabrication or after the device has aged, can be greatly reduced. This can improve manufacturing yield and product reliability.

Moreover, at least a portion of the structure of the metal contacts, such as the back metal contacts described in connection with FIG. 4-FIG. 9, can be made or fabricated using the process or method described above to provide a more cost effective fabrication process and higher throughput. This approach may also be used to achieve appropriate reliability and reasonable yield (e.g., reduced instances of DLDs).

Although the present disclosure has been described in accordance with the implementations shown, one of ordinary skill in the art will readily recognize that there could be variations to the implementations and those variations would be within the scope of the present disclosure.

What is claimed is:

1. A method of forming a back metal structure on a photovoltaic structure, the method comprising:
   sputtering multiple layers on a back surface of the photovoltaic structure, the photovoltaic structure being made of at least one group III-V semiconductor material;
   evaporating, over the multiple layers, one or more additional layers including a metal layer; and
   performing an air break between the sputtering and the evaporating,
   wherein the back metal structure is formed by the multiple layers and the one or more additional layers.

2. The method of claim 1, wherein a deposition rate from the evaporating of the one or more additional layers is greater than a deposition rate from the sputtering of the multiple layers.

3. The method of claim 1, wherein a duration of the evaporating of the one or more additional layers is shorter than a duration of the sputtering of the multiple layers.

4. The method of claim 1, wherein the sputtering of the multiple layers includes sputtering a layer closest to the back surface of the photovoltaic structure, the layer being configured to adhere remaining layers of the multiple layers to the back surface of the photovoltaic structure.

5. The method of claim 1, wherein the sputtering of the multiple layers includes sputtering a layer made of a reflecting material.

6. The method of claim 1, wherein the sputtering of the multiple layers includes sputtering a layer that is closest to the one or more additional layers, the layer being configured to provide a migration barrier from the metal layer to the photovoltaic structure.

7. The method of claim 6, wherein the layer from the multiple layers that is closest to the one or more additional layers has a thickness greater than 100 nanometers.

8. The method of claim 1, wherein the sputtering of the multiple layers is a low-pressure sputtering process.

9. The method of claim 1, wherein the sputtering of the multiple layers includes sputtering one or more of the multiple layers at a target power of 1 Watt/cm$^2$ or higher.

10. The method of claim 1, wherein the sputtering and the evaporating are both performed within a single manufacturing tool in consecutive process operations.

11. The method of claim 1, wherein the sputtering of the multiple layers includes applying multiple sputtering targets within a single manufacturing tool.

12. The method of claim 1, wherein:
    the sputtering of the multiple layers is concurrently performed on a plurality of photovoltaic structures that include the photovoltaic structure, and
    the evaporating of the one or more additional layers over the multiple layers is concurrently performed on the plurality of photovoltaic structures.

13. A method of forming a back metal structure on a photovoltaic structure, the method comprising:
    sputtering multiple layers on a back surface of the photovoltaic structure that is made of a group III-V semiconductor material;
    disposing one or more evaporated layers including a metal layer and over the multiple sputtered layers; and
    forming a back metal structure from the multiple sputtered layers and the one or more evaporated layers,
    wherein the multiple sputtered layers include a layer closest to the back surface of the photovoltaic structure, the layer being configured to adhere remaining layers of the multiple sputtered layers to the back surface of the photovoltaic structure.

14. The method of claim 13, further comprising forming the multiple sputtered layers to include a layer made of a reflecting material.

15. The method of claim 13, further comprising forming the multiple sputtered layers to include a layer that is closest to the one or more evaporated layers, the layer being configured to provide a migration barrier from the metal layer to the photovoltaic structure.

16. The method of claim 13, wherein the layer from the multiple sputtered layers that is closest to the one or more evaporated layers has a thickness greater than 100 nanometers.

17. The method of claim 13, further comprising forming a thickness of the one or more evaporated layers to be greater than a thickness of the multiple sputtered layers.

18. The method of claim 13, further comprising providing one or more of an encapsulant layer, a glass or plastic layer, or an anti-reflective coating (ARC) on a front side of the photovoltaic structure and at least partially over a front surface of the photovoltaic structure.

19. The method of claim 13, further comprising providing one or more of a dielectric layer, a glass or plastic layer, or an ARC disposed on a back side of the photovoltaic structure and at least partially over the back surface of the photovoltaic structure.

20. A method of forming a back metal structure on a photovoltaic structure, the method comprising:
    sputtering multiple layers on a back surface of the photovoltaic structure, the photovoltaic structure being made of at least one group III-V semiconductor material; and
    evaporating, over the multiple layers, one or more additional layers including a metal layer,
    wherein the back metal structure is formed by the multiple layers and the one or more additional layers, and wherein the sputtering of the multiple layers includes sputtering one or more of the multiple layers at a target power of 1 Watt/cm$^2$ or higher.

\* \* \* \* \*